United States Patent [19]
Laverty et al.

[11] 4,425,213
[45] Jan. 10, 1984

[54] DISCRETE LENGTH STRIP PLATER

[75] Inventors: Gerald Laverty, Santa Clara; August Kalin, Sunnyvale; Michael Seyffert, Santa Cruz, all of Calif.

[73] Assignee: National Semiconductor Corporation, Santa Clara, Calif.

[21] Appl. No.: 360,126

[22] Filed: Mar. 22, 1982

[51] Int. Cl.³ .............................................. C25D 17/00
[52] U.S. Cl. ................................... 204/202; 204/206; 204/224 R
[58] Field of Search .................... 204/202, 224 R, 206

[56] References Cited
U.S. PATENT DOCUMENTS

| 3,276,978 | 10/1966 | Spaulding et al. | 204/45 |
| 3,723,283 | 3/1973 | Johnson et al. | 204/206 |
| 4,003,805 | 1/1977 | Schaer et al. | 204/27 |
| 4,186,062 | 1/1980 | Eidschun | 204/15 |

Primary Examiner—T. M. Tufariello
Assistant Examiner—T. L. Williams
Attorney, Agent, or Firm—Michael J. Pollock; Paul J. Winters; Gail W. Woodward

[57] ABSTRACT

A discrete, precut strip, lead frame plating system wherein each strip is loaded onto a linked chain, located against plating masks, contacted electrically, plated, dried, and unloaded from the chain in successive sequential fashion.

6 Claims, 7 Drawing Figures

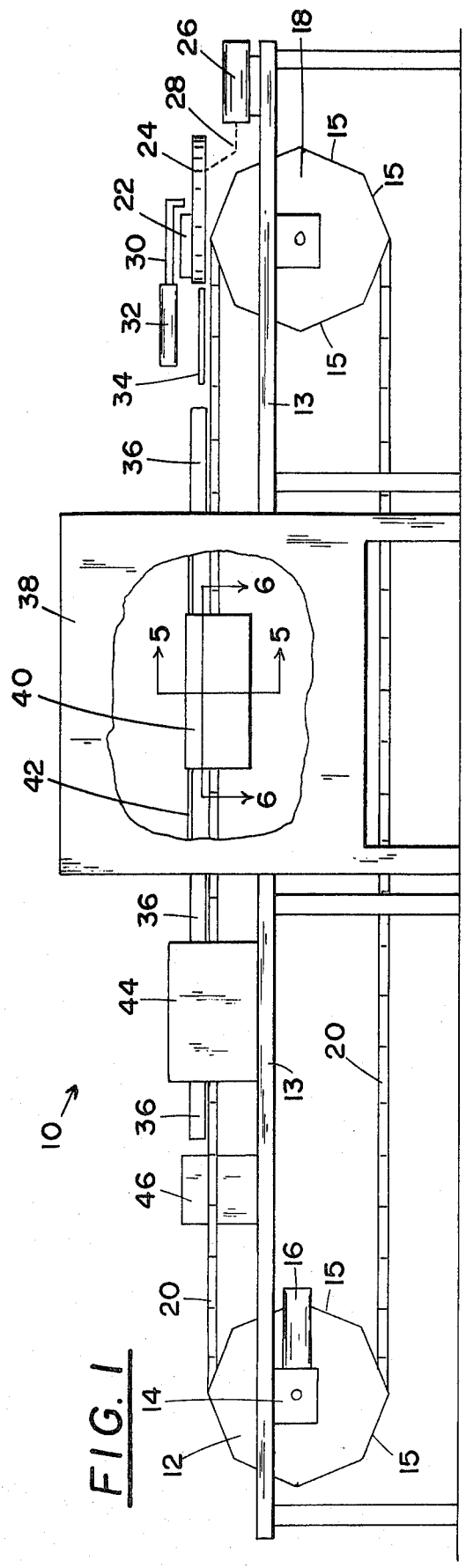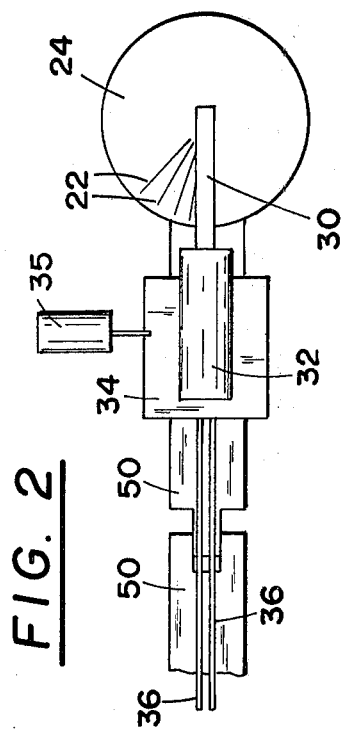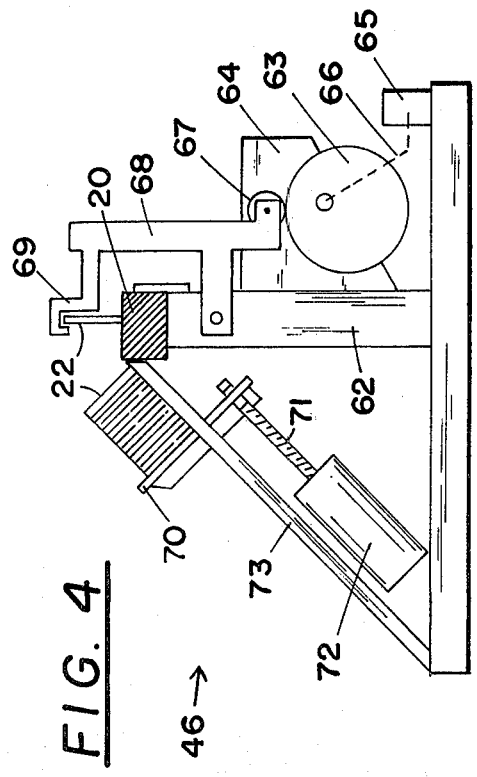

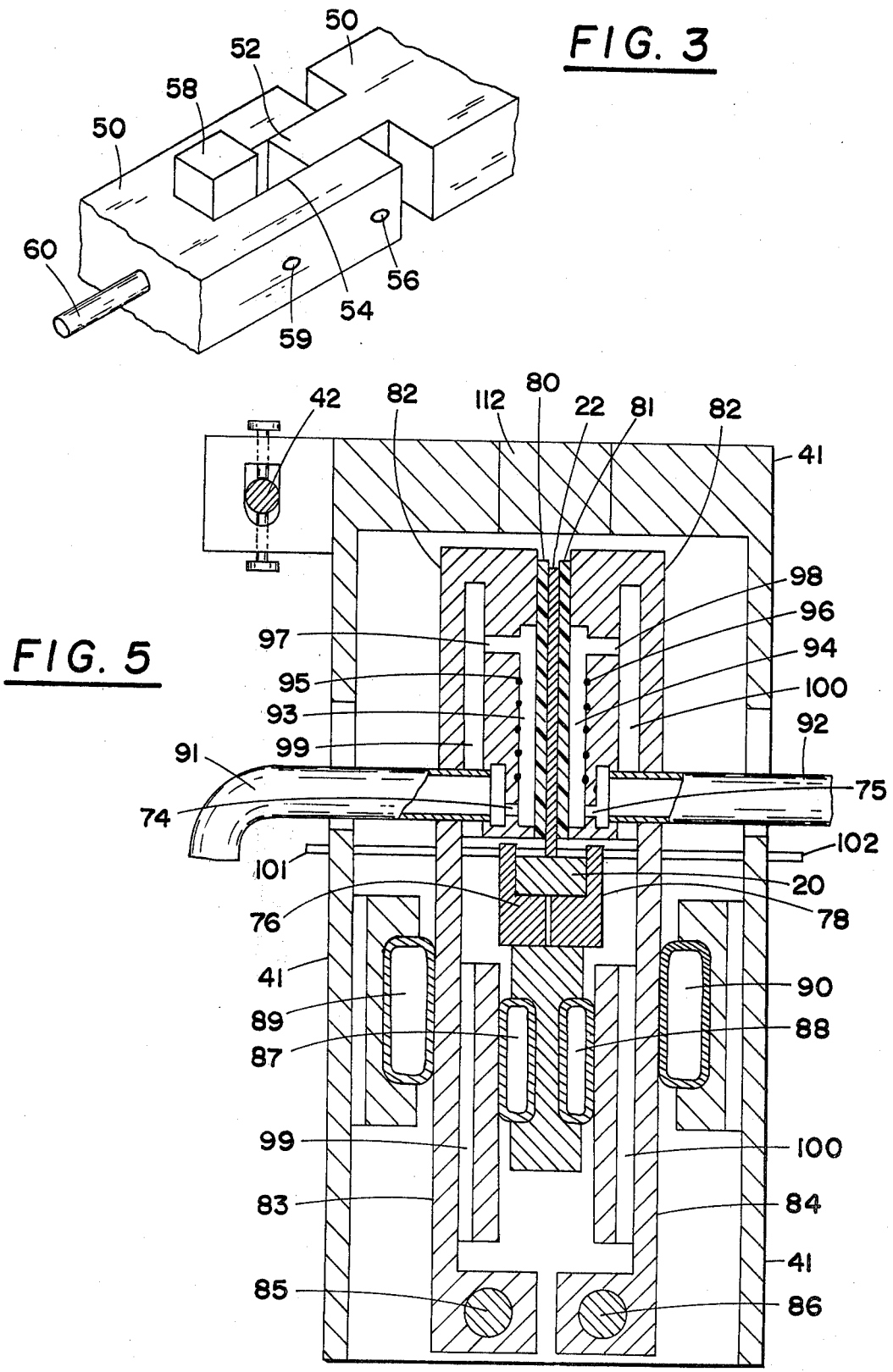

DISCRETE LENGTH STRIP PLATER

BACKGROUND OF THE INVENTION

The invention relates to the plating of metal, specifically strips of metal and is particularly useful in the spot plating of selected small areas on the kind of strips that are called lead frames. Lead frames are used to mount semiconductor chips and the like.

In the prior art, lead frames are formed from a continuous web of metal which is spot plated at the desired locations before it is cut up and shaped for use. Such a reel-to-reel operation is disclosed in U.S. Pat. No. 3,723,283. This process can be wasteful since the cutting and stamping processes may damage the product after it has been plated with precious metals. Another prior art approach is to first cut and shape or chemically etch the lead frames into discrete, nearly finished, short strips and then plate the precious metals only on inspected and acceptable strips. However, this is cumbersome and slow since the individual strips must be loaded onto racks and the racks immersed in plating tanks to deposit the precious metals. The present invention contemplates an entirely new approach to the plating of lead frames that avoids the above difficulties.

SUMMARY OF THE INVENTION

Briefly, the lead frame is formed into discrete strips first and mechanically stamped or shaped as desired. The strips are then inspected for proper length and shape. Acceptable strips are then plated in a plating system that carries the strips, one after another, successively, on a linked chain transport carrier through a series of stations each of which is adapted to handle an individual strip at a time. A special plating means clamps each strip between masks where electrolyte plating solution is selectively applied to the strip. The plating means includes unique electrodes adapted to engage each strip as it arrives and conduct electricity thereto. Also included are automatic pawls that engage both ends of each strip so as to position the strip properly relative to the masks and independently of the carrier chain. This application also discloses suitable loading and unloading mechanisms.

Precious metal is therefore consumed only for the plating of acceptable inspected strips. Loss of precious metal is further reduced in that the initial alignment of the machine, for any given run, may be done with just a single small strip. By contrast, the prior art reel-to-reel approach could require 20–50 feet of web in the system which had to be discarded after set up. In addition, there is less handling of plated strips and rework can be easily stripped and reprocessed.

BRIEF DESCRIPTION OF THE DRAWINGS

FIG. 1 is a schematic drawing of the overall plating system.

FIG. 2 is a top view of the major components of the loading portion of the system of FIG. 1.

FIG. 3 is a fragmentary portion of the carrier chain of FIG. 1 showing how links join together.

FIG. 4 is a schematic drawing of the important parts of the unloading portion of the system.

FIG. 5 is a vertical section of the plating means itself, taken on line 5—5 in FIG. 1, so as to show the plating heads that pivot against each strip.

DESCRIPTION OF THE PREFERRED EMBODIMENT

Figure 6:
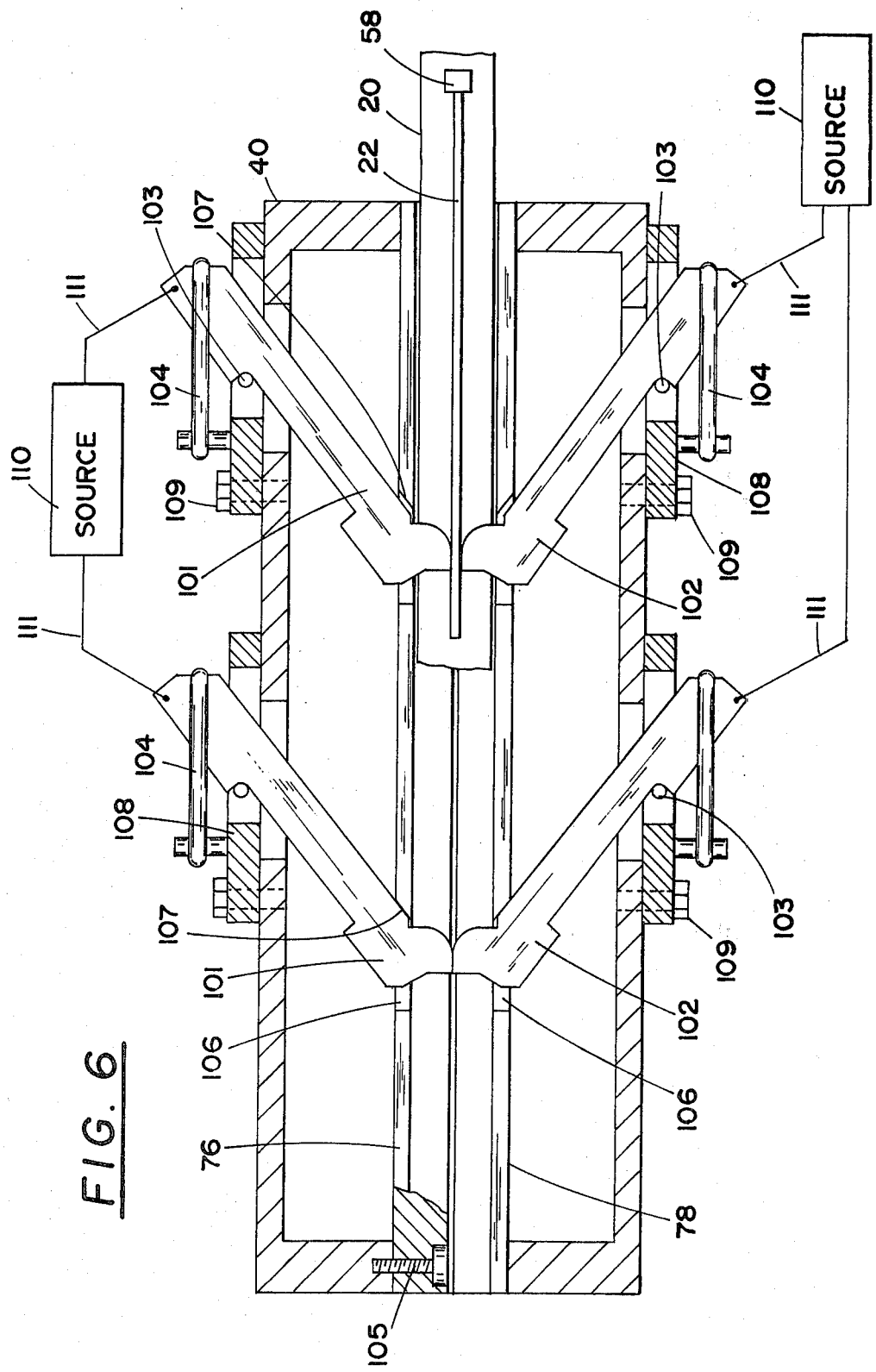
FIG. 6 is a horizontal section of the plating means, taken on line 6—6 in FIG. 1, showing how the cathode connection is made to each strip.

In FIG. 1, the plating system 10, of this invention, is schematically outlined. A pair of wheels 12 and 18 are provided with straight grooved sections 15 about the periphery. Each section 15 accommodates one of the links 50 in a carrier chain 20, which chain follows the path shown in FIG. 1, above and below suitable platforms 13. Motive power is supplied to wheel 12 through a gear box 14 from a motor 16 and is incremental in nature, indexing chain 20 by one link at a time through the various stations in system 10.

Discrete strips of metal 22 are loaded onto chain 20 from a carousel 24, seen from above in FIG. 2. The strips 22 stand on edge in radial slots in carousel 24. A motor 26 rotates carousel 24, as necessary, via a suitable mechanical connection 28. As strips 22 come into position, a pusher arm 30, driven by an actuator 32, which could be, for example, an air cylinder, pushes strip 22 onto a platform 34. Strip 22 remains upright, on edge, because it is located between a pair of strip guides 36. Strip guides 36 are used throughout system 10 to hold the strip vertical in the absence of other support. At the correct time, platform 34 is withdrawn to the side by an actuator 35, so as to drop strip 22 onto one of the links 50 in chain 20.

Turning to FIG. 3, it may be seen that each link 50 has a tongue 52 and a slot 54. The tongue of one link fits into the slot of another, pivoting on a pivot pin 56, so as to form chain 20. Links 50 are constructed from a plating chemical resistant material, such as polypropylene, and rigidized by a buried stainless steel stiffening rod 60. A small ceramic pusher lug 58 is secured in slot 54 by a pin 59 and extends above link 50 so as to engage the rear end of each strip 22 and push the strip through the system.

As the strip advances through the system, it passes through one or more plating tanks 38. Tanks 38 each have one or more plating means 40 therein supported on a suitable force bar 42 in a manner well known to those in the art. (Plating means 40 is described in FIGS. 5-7.) The strip 22 continues on chain 20, between guides 36, through a conventional dryer 44 and into an unloading means 46.

In FIG. 4, unloader 46 is explained. A support 62 forms a base for chain 20 so that strip 22 comes to rest adjacent an unloading arm 69. The top portion of arm 69 guides the strip and maintains it vertical. At the correct time, a cam 63, mounted on a bracket 64, is rotated by a motor 65, through a connection 66, so as to lift a cam follower 67 and tilt a tilt member 68. Strip 22 is pushed off onto a ramp 73 and against a retractable surface 70. Strip 22 falls by gravity out of the top portion of arm 69 onto ramp 73. Strips 22 form a stack on surface 70 which is retracted by a motor 72 and a lead screw 71 as needed to accommodate the stack.

In FIG. 5, plating means 40, of which there may be a plurality, is shown in section. A support housing 41 is mounted on force bar 42. The carrier chain 20 passes through the center, in a groove formed by a pair of L shaped guides 76 and 78. Strip 22 stands on top of chain 20 and is clamped between a pair of plating masks 80 and 81. Masks 80 and 81 have apertures in them, at selected locations, to admit electrolyte plating solution from chambers 93 and 94 to the portions of strip 22 to be plated, in a manner well known to those in the art. FIG. 5 shows masks 80 and 81 in sealing contact with both sides of strip 22, as would be the case during plating. Since masks 80 and 81 are mounted on pivotable plating heads 82, they can be moved away from strip 22. Plating heads 82 are at the end of pivoting support members 83 and 84 which pivot on pivot rods 85 and 86. To open plating heads 82, a pair of bladders 87 and 88 are filled with air, in a conventional fashion, so as to expand against members 83 and 84, while a pair of bladders 89 and 90 are allowed to deflate. The reverse procedure, of course, will close heads 82 on strip 22.

Plating solution is introduced through tubes 91 and 92 and passages 74 and 75 to chambers 93 and 94, where anode contacts 95 and 96, imbedded in the walls of chambers 93 and 94, introduce positive current, again, in known fashion. The plating solution exits through passages 97 and 98 and down through passages 99 and 100 back to tank 38. Negative current is introduced into strip 22, to facilitate the plating, by means of a set of spring loaded electrodes 101 and 102, seen only partially and on edge in FIG. 5. Electrodes 101 and 102 cooperate to grasp the very bottom of strip 22, just above carrier chain 20, and serve the additional function of holding strip 22 upright, in place, when heads 82 are tilted away.

FIG. 6 shows electrodes 101 and 102 more clearly from above. In the preferred embodiment, a pair of electrodes are mounted on each side. Each electrode pivots about a pin 103, pulled by an elastomer band 104 or other suitable spring into a rest position against guide 76 or guide 78. Guides 76 and 78 are both adjustable left and right in FIG. 6, and fixed in place by lock screws 105, one of which is shown in the cutaway portion. By moving guides 76 and 78, one can roughly adjust the rest position of electrodes 101 and 102, since the electrodes rest in slots 106 and against surfaces 107. In FIG. 6, a portion of chain 20 is shown on guides 76 and 78 with a strip 22 thereon, pushed by lug 58, between the two right hand electrodes. Hence, the right hand electrodes are shown pivoted slightly off surfaces 107 in slots 106. Electrodes 101 and 102 may be adjusted even more accurately by moving pivot pins 103 which are mounted on sliding blocks 108. Blocks 108 are secured with screws 109. Current is supplied from a suitable source 110 over wires 111. The electrodes 101 and 102 may become plated after some time. But they are easily removed for cleaning, or replaced, by simply detaching wires 111 and bands 104.

Figure 7:
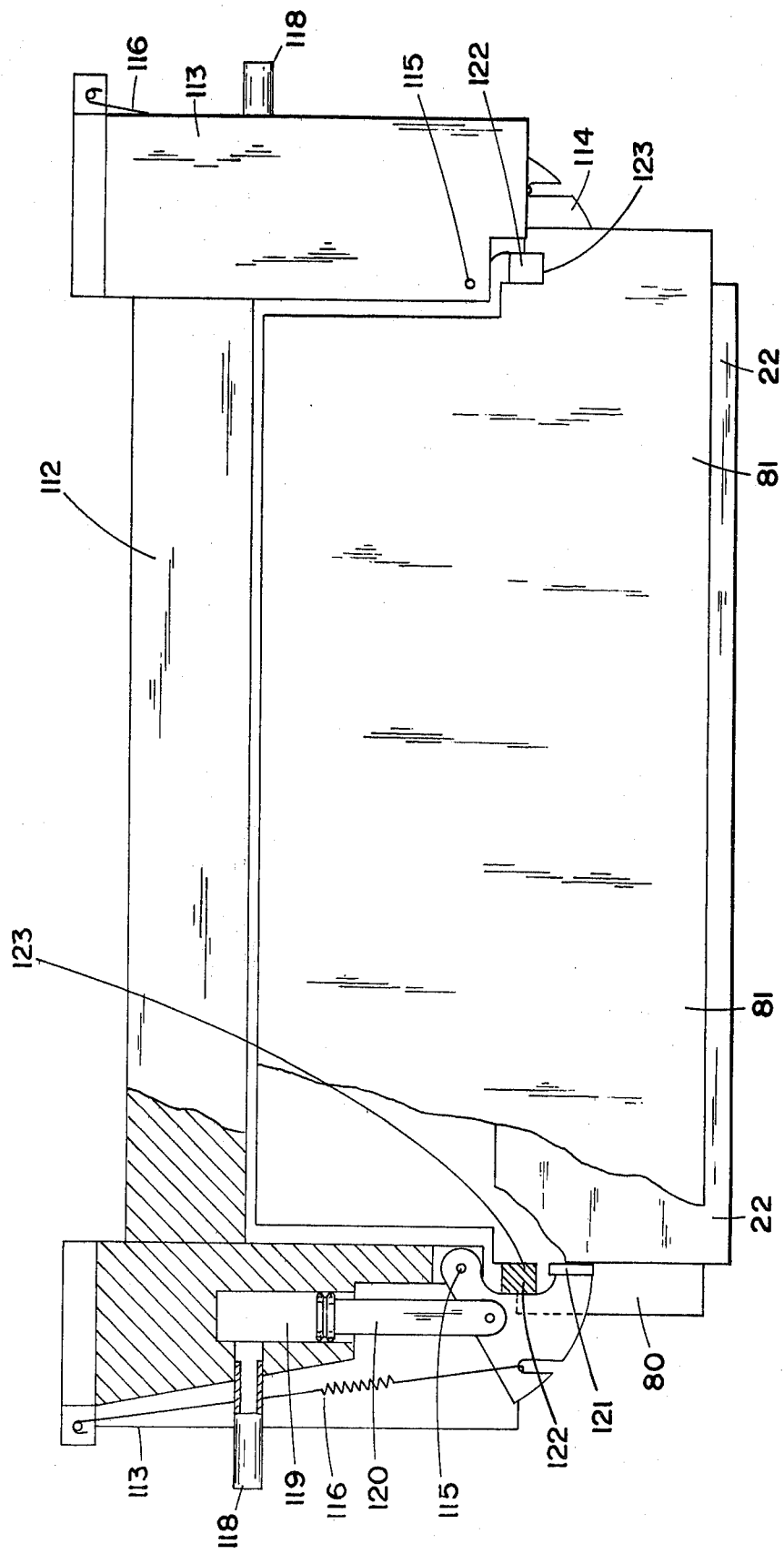
FIG. 7 shows the pawl mechanism that properly locates each discrete strip in the plating means.

FIG. 7 shows apparatus to position strip 22 relative to masks 80 and 81, while strip 22 is held upright by electrodes 101 and 102. A structural support member 112 (located approximately as shown in section in FIG. 5) is provided with pawl supporting assemblies 113 at each end. Assembly 113 at the left end in FIG. 7 is partially sectioned to show how a pawl 114 pivots thereon about a pivot bearing 115 into the ends of the space between masks 80 and 81. Pawls 114 are normally urged upward and out of the way by a spring 116. If pressurized air is supplied through tubes 118 to chambers 119, a piston and clevis rod assembly 120 lowers pawls 114 so that a toe portion 121 engages the end of the strip 22 and centers strip 22 relative to masks 80 and 81. Pawls 114 stop at the exact correct location because they come to rest against bars 122. Bars 122 rest in notches 123 in masks 80 and 81. Once strip 22 is properly located, pawls 114 are allowed to retract and raise out of the space between masks 80 and 81 so that the masks can be closed into sealing contact with both sides of strip 22. Bars 122 insure that masks 80 and 81 remain in alignment with each other.

All of the steps of opening and closing pawls 114, opening and closing the heads 82, turning on and off current and the like, are, of course, sequenced and coordinated with the periodic advance of chain 20 by any suitable control system. Clearly, many details of the structure may be altered without detracting from the basic scope of the invention wherein individual or discrete strips are loaded, plated, and unloaded in sequential fashion and therefore we intend only to be bound by the following claims.

What is claimed is:

1. A plating system for plating selected parts of a series of discrete strips comprising:
    a carrier means comprising a chain of links pivoted to each other for carrying said discrete strips on top of said links through said plating system;
    a support housing disposed about said carrier chain so as to receive said chain therethrough;
    a pair of plating heads, located one on each side of said carrier chain, and movable relative to each other so as to work cooperatively to close on and hold a discrete strip therebetween to permit plating of said selected parts of the strip, said plating heads supported in said housing so as to be movable into sealing contact with said strip, said heads including masking means thereon to cover parts of the strip and expose other selected parts, said heads also having passageways therein operable to convey plating solution to said selected parts during said sealing contact;
    electrodes springably mounted on said support housing in the path of the strip so that the strip slides into contact with the electrodes as it advances on top of the said carrier chain, so as to permit electrical connection to the strip during the conveyance of plating solution to the strip;
    means to periodically move said carrier chain, so as to bring successive strips on said chain between said plating heads and against said electrodes, and stop said chain and strips when the heads are in sealing contact with the strips; and
    automatically actuated pawl means at each end of the support housing operable to move against the ends of each discrete strip and against the plating heads so as to locate the strip lengthwise relative to the plating heads.

2. The system of claim 1 including air inflated bladders to open and close said plating heads about each strip.

3. The system of claim 1 in which said chain is carried on wheels, which wheels have a series of straight grooved sections about the periphery, each straight section adapted to engage one of said links.

4. The system of claim 1 including metal rod stiffening members inside each of said links.

5. The system of claim 1 including means to load strips onto said carrier means comprising a carousel carrying said strips in proximity to the carrier means, and a pusher arm to slide the strips off of the carousel onto a platform above the carrier means, and means to withdraw the platform so as to drop each strip onto the carrier means.

6. The system of claim 1 including means to unload strips from said carrier means comprising a tilting member adjacent the carrier means operable to push the strips off the side of the carrier means onto a ramp, said ramp having a surface upon which the strips stack, said surface being retractable as necessary to accommodate the stack.

* * * * *